(12) United States Patent
Goto

(10) Patent No.: US 6,790,568 B2
(45) Date of Patent: Sep. 14, 2004

(54) PHOTOSENSITIVE TRANSFER MATERIAL AND COLOR FILTER

(75) Inventor: Hidenori Goto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/349,104

(22) Filed: Jan. 23, 2003

(65) Prior Publication Data

US 2003/0143473 A1 Jul. 31, 2003

(30) Foreign Application Priority Data

Jan. 23, 2002 (JP) ........................................ 2002-014120

(51) Int. Cl.⁷ ................................................ G02B 5/20
(52) U.S. Cl. ........................... 430/7; 430/259; 430/262; 430/263
(58) Field of Search ........................... 430/7, 259, 262, 430/263

(56) References Cited

U.S. PATENT DOCUMENTS 5,292,613 A * 3/1994 Sato et al. .................. 430/257
5,294,516 A * 3/1994 Sato et al. .................. 430/262

FOREIGN PATENT DOCUMENTS

| JP | A 5-72724 | | 3/1993 |
| JP | 11-149008 A | * | 6/1999 |

* cited by examiner

Primary Examiner—John A. McPherson
(74) Attorney, Agent, or Firm—Sughrue Mion, PLLC

(57) ABSTRACT

The present invention provides a photosensitive transfer material comprising a temporary support, a peelable layer, an alkali-soluble thermoplastic resin layer, an intermediate layer and a photosensitive resin layer that are disposed in this order, wherein the bonding strength between the peelable layer and the thermoplastic resin layer is the smallest of all the bonding strengths between neighboring layers.

20 Claims, No Drawings

PHOTOSENSITIVE TRANSFER MATERIAL AND COLOR FILTER

BACKGROUND OF THE INVENTION

1. Field of the Invention

The present invention relates to a photosensitive transfer material, and, particularly to a photosensitive transfer material in which a temporary support and a photosensitive layer can be completely separated and to a color filter using the photosensitive transfer material.

2. Description of the Related Art

Photosensitive transfer materials whose photosensitive resin layer is transferred to a substrate are used in print wiring, intaglio printing and relief printing and for making nameplates, multicolor trial printing print samples, offset printing plates and color filters.

The photosensitive transfer material usually comprises a support, an intermediate layer (peelable layer) or an intermediate layer and an alkali-soluble thermoplastic resin layer, and a photosensitive resin layer. When forming an image on a substrate, the formation is made by overlapping a separately prepared substrate on the photosensitive resin layer of the photosensitive transfer material, thereafter peeling off only the (temporary) support, exposing the photosensitive resin layer imagewise through the intermediate layer and developing the image.

The aforementioned intermediate layer is an oxygen-blocking layer, whereby polymerization of the photosensitive resin layer by exposure can be carried out even when in contact with air without suffering any polymerization inhibition due to oxygen. Because the intermediate layer is thin (about 0.5 to 5 $\mu$m), it does not adversely affect resolution. The irregularities of a base (namely, irregularities due to pixels that have already been formed) can be absorbed by the alkali-soluble thermoplastic resin layer. These layers are alkali-soluble and are therefore removable when developing.

One such example includes color filters used in color liquid crystal displays. These generally have a fundamental structure in which each pixel of R, G and B (red, green and blue) is formed and a black matrix (K) for improving display contrast is formed in the space between each pixel.

As to the method of forming a color filter, these layers (the alkali-soluble thermoplastic resin layer, intermediate layer and photosensitive resin layer) are transferred to the surface of the color filter substrate by using the above-described transfer material. Next, the temporary support is peeled off and exposure using a predetermined mask and developing using an alkali to form a pattern are carried out. It is essential that each of these R, G and B pixels of the color filter and the surface of K be very smooth.

Problems often occur during high-speed transfer of the photosensitive transfer material. Namely, a part of the alkali-soluble thermoplastic resin layer may remain on the temporary support when peeling off the temporary support and it is impossible to separate completely the temporary support and the alkali-soluble thermoplastic resin layer. Therefore, it is often the case that acceptable smoothness cannot be obtained during exposure because of the surface irregularities in the alkali-soluble thermoplastic resin layer.

A method is described in Japanese Patent Application No. 3-120228 for peeling the interface other than that between the thermoplastic resin layer and the temporary support. This method uses a photosensitive transfer material prepared by disposing a thermoplastic resin layer, a peelable layer and a photosensitive resin layer in this order on a temporary support, especially, a plastic film undercoated with a gelatin, where the photosensitive resin layer is bonded to a substrate and then the temporary support and the thermoplastic resin layer are peeled and removed simultaneously so as to transfer the photosensitive resin layer to the substrate. However, in this method, it is extremely difficult to control the peelability of the peelable layer from the thermoplastic resin layer and is, from an automated peeling operation standpoint, far from satisfactory.

SUMMARY OF THE INVENTION

The object of the present invention is to solve the aforementioned prior art problem and to provide a photosensitive transfer material in which an alkali-soluble thermoplastic resin layer and a temporary support can be completely separated without a part of the alkali-soluble thermoplastic resin layer remaining on the temporary support even if a photosensitive transfer material is transferred at a high speed and also to provide a color filter using the photosensitive transfer material.

The invention has been completed as a result of the intensive studies made by the inventors and concerning interfacial peelability.

A first aspect of the invention provides a photosensitive transfer material comprising a temporary support, a peelable layer, an alkali-soluble thermoplastic resin layer, an intermediate layer and a photosensitive resin layer that are disposed in this order, wherein the bonding strength between the peelable layer and the thermoplastic resin layer is the smallest of all the bonding strengths between neighboring layers.

The provision of the peelable layer between the temporary support and thermoplastic resin of the photosensitive transfer material makes it possible to obtain a photosensitive transfer material in which the thermoplastic resin and the temporary support can be completely separated when peeling off the temporary support even if the photosensitive transfer material is transferred at a high speed.

Also, a second aspect of the invention provides a color filter formed using the above-mentioned photosensitive transfer material.

DETAILED DESCRIPTION OF THE PREFERRED EMBODIMENTS

<<Photosensitive Transfer Material>>

A photosensitive transfer material according to the present invention comprises a temporary support, a peelable layer, an alkali-soluble thermoplastic resin layer, an intermediate layer and a photosensitive resin layer in this order. In the photosensitive transfer material, the bonding strength between the thermoplastic resin layer and the peelable layer is the smallest of all the bonding strengths between neighboring layers. The peelable layer preferably contains at least one type selected from a group consisting of a polyolefin having a carboxyl group and/or a carboxylate group, a polyolefin having a sulfonic group and/or sulfonate group and a fluorocarbon derivative.

It is more preferable that the photosensitive transfer material contain, as a crosslinking agent, at least one type selected from an epoxy compound, a blocked isocyanate and a melamine compound and contain colloidal silica in the above-described peelable layer.

The photosensitive transfer material of the invention and a method of producing a color filter using the photosensitive transfer material according to the invention will be explained hereinafter.

<Peelable Layer>

The photosensitive transfer material of the invention has a peelable layer.

The peelable layer preferably contains, as a binder, a polyolefin having a carboxyl group and/or a carboxylate group or a sulfonic acid group and/or a sulfonate group. In the invention, the polyolefin is usually used in the form of an aqueous solution or a water dispersion. Specific examples of the polyolefin having a carboxyl group and/or a carboxylate group and the polyolefin having a sulfonic acid group and/or a sulfonate group include, but are not limited to, waxes, resins and rubber-like products made of homopolymers and copolymers of 1-olefin type unsaturated hydrocarbons such as ethylene, propylene, 1-butene, isobutene, 1-pentene, 2-metyl-1,3-butadiene and 4-metyl-1-pentene (e.g., polyethylene, polypropylene, poly-1-butene, poly-isobutene, poly-1-pentene, poly-2-metyl-1,3-butadiene (isoprene rubber), poly-4-methyl-1-pentene, ethylene/propylene copolymers, ethylene/1-butene copolymers and propylene/1-butene copolymers), rubber-like copolymers of two or more of the above-described 1-olefins and a conjugated or non-conjugated diene (e.g., ethylene/propylene/ethylidene norbornane terpolymers and ethylene/propylene/1,5-hexadiene terpolymers), copolymers of a 1-olefin and a conjugated or non-conjugated diene (e.g., ethylene/butadiene copolymers, ethylene/ethylidene norbornane copolymers and isobutene/isoprene copolymers), copolymers of a 1-olefin, particularly ethylene and vinyl acetate and completely or partially saponified products thereof and graft polymers obtained by grafting the above-described conjugated or non-conjugated diene or vinyl acetate on homopolymers and copolymers of 1-olefin and completely or partially saponified products thereof. These compounds are described in Japanese Patent Application Publication (JP-B) No. 5-41656.

The polyolefin having a carboxyl group and/or a carboxylate group or a sulfonic acid group and/or a sulfonate group means those obtained by introducing a carboxyl group and/or a carboxylate group or a sulfonic acid group and/or a sulfonate group into the above-mentioned polyolefin. As to the method of introducing a carboxyl group, a monomer having a carboxyl group in its molecule is copolymerized to prepare a target copolymer. Specifically, the copolymer may be prepared by copolymerizing acrylic acid, methacrylic acid, itaconic acid, maleic acid or fumaric acid.

Examples of the carboxylate group include amine salts such as ammonium salts of the aforementioned carboxyl group, monovalent metalic salt including as sodium or potassium, and mixtures of these salts.

Examples of the sulfonic acid group include a p-toluenesulfonic acid group and methasulfonic acid group.

Examples of the sulfonate group include amine salts such as ammonium salts of the aforementioned sulfonic acid, monovalent metalic salt including sodium or potassium, and mixtures of these salts.

Among these compounds, polyolefins having a carboxylic group and/or a carboxylate group are preferable and those prepared by introducing methacrylic acid, acrylic acid, maleic acid or salts of these acids into the polyolefin are particularly preferable.

The ratio of modification is preferably 1 to 25% and particularly preferably 5 to 20%. When the ratio falls in a range from 1 to 25%, adhesiveness is not enhanced, so that the peelable layer can be peeled off properly.

Preferable examples of the polyolefin having a carboxyl group and/or a carboxylate group include Chemipearl S100, S111, S120, S650, S659 and S75N (all of these products are manufactured by Mitsui Chemicals, Inc.).

Examples of the fluorocarbon derivative include tetrafluoroethylene, trifluoroethylene and difluoroethylene. Among these compounds, tetrafluoroethylene is particularly preferable.

In the peelable layer, other water-soluble binder may be used together to the extent that any performance is not impaired. Examples of the water-soluble binder include copolymers made of monomers selected from vinyl chloride, vinylidene chloride, butadiene, methacrylic acid, acrylic acid, itaconic acid, maleic acid and maleic acid anhydride, and natural polymers such as polyethyleneimine, epoxy resin-grafted gelatin, nitrocellulose and gelatin, polyvinyl alcohol, vinyl acetate-maleic acid anhydride copolymers, acrylic acid-acrylamide copolymers, styrene-maleic acid anhydride copolymers and methyl cellulose. As for the methyl cellulose, water-soluble methyl cellulose in which the degree of substitution with a methyl group is 2.5 or less is preferable. The amount of the methyl cellulose to be added is preferably 0.1% by weight to 40% by weight based on all binders forming the peelable layer. The water-soluble methyl cellulose is described in Japanese Patent Application Laid-Open (JP-A) No. 1-210947.

Further, a matting agent (silicon dioxide, polymethylacrylate and polystyrene) is preferably used as a blocking preventive agent and a hardener such as a melamine compound, blocked isocyanate or epoxy compound and a filler such as colloidal silica are preferably used as a crosslinking agent for a binder in order to impart scratch resistance to the binder.

In the invention, a polyfunctional epoxy compound may be used. Examples of the epoxy compound include dibromophenyl glycidyl ether, dibromoneopentyl glycol diglycidyl ether, emulsions of an epoxycresol novolac resin, modified bisphenol A-type epoxy emulsions, diglycidyl adipate, diglycidyl o-phthalate, hydroquinone diglycidyl ether, bisphenol S glycidyl ether, diglycidyl terephthalate, glycidylphthalimide, propylene glycol diglycidyl ether, polypropylene glycol diglycidyl ether, polytetramethylene glycol diglycidyl ether, allyl glycidyl ether, 2-ethylhexyl glycidyl ether, phenyl glycidyl ether, phenol (EO) 5 glycidyl ether, p-tertiarybutylphenyl glycidyl ether, lauryl alcohol (EO) 15 glycidyl ether; glycidyl ether of a mixture of alcohols having 12 or 13 carbon atoms, glycerol polyglycidyl ether, trimethylolpropane polyglycidyl ether, resorcin diglycidyl ether, neopentyl glycol diglycidyl ether, 1,6-hexanediol diglycidyl ether, ethylenepolyethylene glycol diglycidyl ether, sorbitol polyglycidyl ether, sorbitan polyglycidyl ether, polyglycerol polyglycidyl ether, pentaerythritol polyglycidyl ether, diglycerol polyglycidyl ether and triglycidyl-tris(2-hydroxyethyl)isocyanurate. Among these epoxy compounds, glycidyl ethers are particularly preferable.

The epoxy equivalence effective for the invention is preferably 70 to 1000 WPE. When the epoxy equivalence exceeds 1000 WPE, cured density is small and high strength is not obtained.

The blocked isocyanate in the invention means compounds in which the terminal isocyanate group of an isocyanate is masked with a blocking agent. Examples of the blocked isocyanate include (a) those in which a hydrophilic group block body made of a carbamoylsulfonate group ($-NHCOSO_3-$) is formed at the terminal of an isocyanate compound to block an active isocyanate group, (b) those in which an active isocyanate group is blocked with isopropylidene malonate, which blocked isocyanate is obtained by a reaction of HDI isocyanurate, isopropylidene malonate and triethylamine and (c) those in which an active isocyanate group is blocked with phenol or a derivative thereof.

If such a blocked isocyanate is mixed with the aforementioned polymer, followed by heating, the polymer is crosslinked by the blocked isocyanate to thereby obtain scratch resistance.

Examples of the melamine compound to be used in the invention include compounds containing two or more (preferably three or more) methylol groups and/or alkoxymethyl groups in a melamine molecule and condensed polymers of these compounds such as melamine resins and melamine/urea resins. Examples of initial condensates of melamine and formalin include dimethylol melamine, trimethylol melamine, tetramethylol melamine, pentamethylol melamine and hexamethylol melamine. Specific examples of commercially available products of the melamine compound include, but are not limited to, Sumitex Resin M-3, MW, MK and MC (manufactured by Sumitomo Chemical Co., Ltd.).

Examples of the aforementioned condensed polymer include hexamethylol melamine resins, trimethylol melamine resins and trimethylol trimethoxymethylmelamine resins. Examples of commercially available products include, but are not limited to, MA-1 and MA-204 (manufactured by Sumitomo Bakelite Co., Ltd.), Beckamine MA-S, Beckamine APM and Beckamine J-101 (manufactured by Dainippon Ink and Chemicals, Incorporated), Euroid 344 (manufactured by Mitsui Toatsu Chemicals, Inc) and Oshika Resin M31 and Oshika Resin PWP-8 (manufactured by Oshika Corporation).

The melamine compounds in the invention are preferably those in which the functional group equivalence shown as the value obtained by dividing a molecular weight of the compound by the number of functional groups contained in one molecule is preferably 50 to 300. Here, the functional group indicates a methylol group and/or an alkoxymethyl group. When this value exceeds 300, only small cured density is obtained and high strength is not obtained. When the amount of such a melamine compound is increased to obtain high strength, coatability is deteriorated. Moreover, when cured density is small, scratches tend to occur. Also, the ability of retaining a conductive metal oxide is deteriorated. When the functional group equivalence is less than 50, cured density is heightened but transparency is impaired and not bettered even if the amount of the melamine compound is reduced. The amount of the aqueous melamine compound to be added in the invention is 0.1 to 100% by weight and preferably 10 to 90% by weight based on the aforementioned polymer.

These melamine compound may be used alone or in combination. Also, the melamine compound may be used in combination with other compound. Examples of other compound include various hardeners described in, for example, "The Theory of the Photographic Process", 3rd edition (1966), written by C. E. K. Meers and T. H. James, U.S. Pat. Nos. 3,316,095, 3,232,764, 3,288,775, 2,732,303, 3,635,718, 3,232,763, 2,732,316, 2,586,168, 3,103,437, 3,017,280, 2,983,611, 2,725,294, 2,725,295, 3,100,704, 3,091,537, 3,321,313, 3,543,292 and 3,125,449 and U.K. Patent Nos. 994,869 and 1,167,207.

Typical examples of the hardener include, but are not limited to, aldehyde compounds and their derivatives such as mucochloric acid, mucobromic acid, mucophenoxychloric acid, mucophenoxybromic acid, formaldehyde, glyoxal, monomethylglyoxal, 2,3-dihydroxy-1,4-dioxane, 2,3-dihydroxy-5-methyl-1,4-dioxanesuccinaldehyde, 2,5-dimethoxytetrahydrofuran and glutaraldehyde; active vinyl compounds such as divinylsulfone-N,N'-ethylenebis(vinylsulfonylacetamide), 1,3-bis(vinylsulfonyl)-2-propanol, methylenebismaleimide, 5-acetyl-1,3-diacryloyl-hexahydro-s-triazine, 1,3,5-triacryloyl-hexahydro-s-triazine and 1,3,5-trivinylsulfonyl-hexahydro-s-triazine; active halogen compounds such as 2,4-dichloro-6-hydroxy-s-triazine sodium salt, 2,4-dichloro-6-(4-sulfoanilino)-s-triazine sodium salt, 2,4-dichloro-6-(2-sulfoethylamino)-s-triazine and N,N'-bis(2-chloroethylcarbamyl)piperazine; epoxy compounds such as bis(2,3-epoxypropyl)methylpropylammonium p-toluenesulfonate, 1,4-bis(2',3'-epoxypropyloxy)butane, 1,3,5-triglycidylisocyanurate, 1,3-diglycidyl-5-(γ-acetoxy-β-oxypropyl)isocyanurate, sorbitol polyglycidyl ethers, polyglycerol polyglycidyl ethers, pentaerythritol polyglycidyl ethers, diglycerol polyglycidyl ether, 1,3,5-triglycidyl(2-hydroxyethyl)isocyanurate, glycerol polyglycerol ethers and trimethylolpropane glycidyl ethers; ethyleneimine compounds such as 2,4,6-triethylene-s-triazine, 1,6-hexamethylene-N,N'-bisethyleneurea and bis-β-ethyleneiminoethyl thioether; methanesulfonate compounds such as 1,2-di(methanesulfonoxy)ethane, 1,4-di(methanesulfonoxy)butane and 1,5-di(methanesulfonoxy)pentane; carbodiimide compounds such as dicyclohexylcarbodiimide and 1-dicyclohexyl-3-(3-trimethylaminopropyl)carbodiimide hydrochloride; isooxazole compounds such as 2,5-dimethylisooxazole; inorganic compounds such as chrome alum and chromium acetate; dehydrated condensed peptide reagents such as N-carboethoxy-2-isopropoxy-1,2-dihydroquinoline and N-(1-morpholinocarboxy)-4-methylpyridium chloride; active ester compounds such as N,N'-adipoyldioxydisuccinimide and N,N'-terephthaloyldioxydisuccinimide; isocyanates such as toluene-2,4-diisocyanate and 1,6-hexamethylenediisocyanate; epichlorohydrin compounds such as polyamide-polyamine-epichlorohydrin reaction products.

The peelable layer according to the invention preferably contains, besides the aforementioned composition, a surfactant and an inorganic pigment. Specific examples of the surfactant include anionic surfactants, nonionic surfactants, cationic surfactants and other reactive surfactants. These surfactants may be used alone or in combination.

Specific examples of the nonionic surfactant include polyoxyethylene lauryl ether, polyoxyethylene octylphenyl ether, polyoxyethylene oleylphenyl ether, polyoxyethylene nonylphenyl ether, oxyethylene oxypropylene block copolymers, tert-octylphenoxyethylpolyethoxyethanol and nonylphenoxyethylpolyethoxyethanol.

Specific examples of the anionic surfactant include sodium dodecylbenzenesulfonate, sodium laurylsulfate, sodium alkyldiphenyl ether disulfonate, sodium alkylnaphthalenesulfonate, sodium dialkylsulfosuccinate, sodium stearate, potassium oleate, sodium dioctylsulfosuccinate, sodium polyoxyethylenealkyl ether sulfate, sodium polyoxyethylenealkyl ether sulfate, sodium polyoxyethylenealkylphenyl ether sulfate, sodium dialkylsulfosuccinate, sodium oleate and sodium tert-octylphenoxyethoxypolyethoxyethylsulfate.

Specific examples of the cationic surfactant include lauryltrimethylammonium chloride and stearyltrimethylammonium chloride.

The thickness of the peelable layer according to the invention is preferably 0.01 to 0.5 μm and more preferably 0.02 to 0.2 μm.

<Support>

The support of the aforementioned photosensitive transfer material is preferably constituted of a chemically and thermally stable and flexible material. A thin sheet made of, for example, Teflon (R), polyethylene terephthalate, polyethylene naphthalate, polycarbonate, polyethylene or polypropylene or a laminate of these shin sheets is preferable as the support. The thickness of the support is preferably 5 to 30 µm and particularly preferably 20 to 150 µm.

The following surface treatment is usually carried out to bond the peelable layer firmly to the surface of the aforementioned plastic film support. There are two surface treating methods including (1) a method in which surface activating treatment such as treatment using chemicals, mechanical treatment, corona discharge treatment, flame treatment, ultraviolet ray treatment, high-frequency treatment, glow discharge treatment, activated plasma treatment, laser treatment, mixed acid treatment or ozonation is applied to the support and then a photographic emulsion (coating solution for forming a photosensitive layer) is applied directly to the treated surface to obtain strong bonding strength and (2) a method in which any of these treatments is carried out, then an undercoat layer is disposed on the support and a peelable layer is applied to the undercoat layer. It is considered that all of these surface treatments form a polar group or polar groups on the surface of the support which is originally hydrophobic, remove a thin layer adversely affecting the adhesion to the surface and increase the crosslinking density of the surface to thereby increase the bonding strength to the surface and that, as a result, the affinity of the surface to a polar group of components contained in a solution for a peelable layer is increased and that the fastness of the adhesive surface is increased and that whereby the adhesion of the surface of the support to the undercoat layer or the adhesion of the peelable layer to the surface of the support is improved.

Examples of the high molecular material used in the undercoat and peelable layer include synthetic or natural hydrophilic high molecular compounds such as copolymers made of monomers selected from vinyl chloride, vinylidene chloride, butadiene, methacrylic acid, acrylic acid, itaconic acid, maleic acid and maleic acid anhydride, polyethyleneimine, epoxy resin-grafted gelatin, nitrocellulose, polyvinyl alcohol, vinyl acetate-maleic acid anhydride copolymers, acrylic acid-acrylamide copolymers, styrene-maleic acid anhydride copolymers, methyl cellulose, polyvinyl alcohol, acylated gelatin such as gelatin phthalate and gelatin maleate, cellulose derivatives such as carboxymethyl cellulose and hydroxyethyl cellulose, grafted gelatins obtained by grafting an acrylic acid, methacrylic acid or amide on a gelatin, polyhydroxyalkyl acrylate, polyvinyl pyrrolidone, vinyl pyrrolidone/vinyl acetate copolymers, casein, agarose, albumin, sodium alginate, polysaccharide, agar, starch, grafted starch, polyacrylamide, polyethyleneimineacyl compounds and homopolymers or copolymers of acrylic acid, methacrylic acid acrylamide, N-substituted acrylamide or N-substituted methacrylamide or partial hydrolysates of these compounds. These compounds may be used alone or in combination. In the formation of the undercoat layer, a crosslinking agent such as a melamine compound, epoxy compound or blocked isocyanate is usually used.

Examples of a method of applying the peelable layer include a so-called multilayer method in which a layer which can firmly adhere to a support as an undercoat layer is provided and a peelable layer is formed thereon by application, and a single layer method in which only a peelable layer is applied. A method in which a peelable layer made of a high molecular substance is formed with an aqueous system is used as a method of forming the peelable layer.

A coating solution for the peelable layer or undercoat layer according to the invention may be applied by a well-known coating method, for example, a dip coating method, air knife coating method, curtain coating method, roller coating method, wire bar coating method and gravure coating method or an extrusion coating method using a hopper as described in U.S. Pat. No. 2,681,294. When a second peelable layer is further disposed on the peelable layer, two or more layers can be applied at the same time in accordance with, for example, a method as described in U.S. Pat. Nos. 2,761,791, 3,508,947, 2,941,898 and 3,526,528 or a method as described in "Coating Engineering", p.253, written by Ozaki Hitoshi, published by Asakura Shoten in 1973. The thickness of the peelable layer is preferably in a range from 0.01 to 1 µm and more preferably in a range from 0.01 to 0.2 µm. When the thickness is in a range from 0.01 to 1 µm, the coating solution can be evenly applied, so that coating unevenness of products is scarcely caused and antistatic ability and scratch resistance are not deteriorated.

An antistatic agent, a crosslinking agent, a matting agent and a blocking preventing agent may be added to a hydrophilic polymer such as those aforementioned if necessary.

<Antistatic Layer and the Like>

An antistatic layer and a surface layer maybe disposed in this order on the surface of the aforementioned plastic film support on the side opposite to the peelable layer. The antistatic layer in the invention is a layer in which conductive metal oxide particles are dispersed in a cured product made of any one of the following polymers or a mixture of these polymers and a melamine compound.

An acrylic resin, vinyl resin, polyurethane resin or polyester resin is used as the polymer.

Examples of materials of the conductive metal oxide particles include ZnO, $TiO_2$, $SnO_2$, $Al_2O_3$, $In_2O_3$, MgO, BaO and $MoO_3$ and complex oxides of these metal oxides, and metal oxides prepared by compounding a hetero atom in these metal oxides. $SnO_2$, ZnO, $Al_2O_3$, $TiO_2$, $In_2O_3$ and MgO are preferable as the metal oxide, $SnO_2$, ZnO, $In_2O_3$ and $TiO_2$ are more preferable and $SnO_2$ is particularly preferable. Examples of the conductive metal oxide containing a small amount of a hetero atom include ZnO doped with a hetero atom such as Al or In and $TiO_2$ doped with a hetero atom such as Nb or Ta, $In_2O_3$ doped with a hetero atom such as Sn and $SnO_2$ doped with a hetero atom such as Sb, Nb or a halogen atom, in which the amount of the hetero atom is 0.01 to 30 mol % (preferably 0.1 to 10 mol %). When the amount of the hetero atom is in a range from 0.01 to 30 mol %, satisfactory conductivity can be imparted to the oxide or complex oxide, a phenomenon that the blackening of particles is increased and that the antistatic layer is blacked does not occur. Therefore, Metal oxides or complex metal oxides containing a small amount of a hetero element are preferable as materials of the conductive metal oxide particle in the invention. Also, metal oxides having an oxygen defect in the crystal structure are also preferable.

The conductive metal oxide particles are contained in the antistatic layer in an amount ranging preferably from 10 to 1000% by weight and more preferably from 200 to 800% by weight based on the binder (sum of the aforementioned polymer and melamine compound). When the amount is in a range from 10 to 1000% by weight, sufficient antistatic ability is obtained and it is possible to prevent the conductive metal oxide particles from falling down from the photosensitive material.

Although the particle diameter of the conductive metal oxide particle is preferably small to make light scattering as small as possible, it must be determined using the ratio of the refractive index of the particle to that of the binder as a parameter and may be obtained using the Mie theory. The average particle diameter is generally in a range from 0.001 to 0.5 μm and preferably in a range from 0.003 to 0.2 μm. Here, the average particle diameter is expressed by a value including not only the primary particle diameter but also the particle diameter of a higher-order structure of the conductive metal oxide particles.

When microparticles of the metal oxide are added to a coating solution for forming the antistatic layer, they may be added as they are and dispersed in the coating solution. However, it is preferable to add a dispersion prepared by dispersing these particles in a solvent (containing a dispersant and a binder as required) such as water.

The antistatic layer in the invention contains a cured product made of the aforementioned polymer (an acrylic resin, vinyl resin, polyurethane resin or polyester resin) and melamine compound as a binder for dispersing and supporting the conductive metal oxide particles. In the invention, it is preferable to use aqueous polymer and melamine compound or use them in the form of a dispersion in which they are dispersed in water, such as an emulsion, from the viewpoint of maintaining good working conditions and preventing air pollution. Also, the polymer has any one of a methylol group, hydroxyl group, carboxyl group and glycidyl group to enable a crosslinking reaction with a melamine compound. Among these groups, a hydroxyl group and carboxyl group are preferable and a carboxyl group is particularly preferable. The content of the hydroxyl group or carboxyl group in the polymer is preferably 0.01 to 40 mol % per 1 kg and particularly preferably 0.1 to 25 mol % per 1 kg.

Examples of the acrylic resin include homopolymers of any one of acrylic acid, acrylates such as alkyl acrylates, acrylamide, acrylonitrile, methacrylic acid, methacrylates such as alkyl methacrylates, methacrylamide and methacrylonitrile, and copolymers obtained by polymerizing two or more of these monomers. Among these compounds, homopolymers of any one of acrylates such as alkyl acrylates and methacrylates such as alkyl methacrylates, and copolymers obtained by polymerizing two or more of these monomers are preferable. Examples of these homopolymers and copolymers include homopolymers of any one of acrylates and methacrylates with an alkyl group having 1 to 6 carbon atoms, and copolymers obtained by polymerizing two or more of these monomers. The acrylic resin is a polymer which has the above-described composition as its major component and uses as a part of starting materials a monomer having any one of, for example, a methylol group, hydroxyl group, carboxyl group and glycidyl group to enable a crosslinking reaction with a melamine compound.

Examples of the aforementioned vinyl resin include polyvinyl alcohol, acid-modified polyvinyl alcohol, polyvinylformal, polyvinylbutyral, polyvinyl methyl ether, polyolefin, ethylene/butadiene copolymers, polyvinyl acetate, vinyl chloride/vinyl acetate copolymers, vinyl chloride/(metha)acrylate copolymers and ethylene/vinyl acetate copolymers (preferably ethylene/vinyl acetate/ (meth)acrylate terpolymers). Among these resins, polyvinyl alcohol, acid-modified polyvinyl alcohol, polyvinylformal, polyolefin, ethylene/butadiene copolymers and ethylene/ vinyl acetate copolymers (preferably ethylene/vinyl acetate/ acrylate terpolymers) are preferable. As for the vinyl resin, polyvinyl alcohol, acid-modified polyvinyl alcohol, polyvinyl formal, polyvinylbutyral, polyvinyl methyl ether and polyvinyl acetate are prepared as polymers having a hydroxyl group by allowing, for example, a vinyl alcohol unit to remain in the polymer and other polymers are prepared as polymers obtained using a part of starting materials a monomer having any of a methylol group, hydroxyl group, carboxyl group and glycidyl group to enable a crosslinking reaction with a melamine compound.

Examples of the aforementioned polyurethane resin include polyurethanes derived from any one or mixture of polyhydroxy compounds (e.g., ethylene glycol, propylene glycol, glycerol and trimethylolpropane), aliphatic polyester type polyols obtained by the reaction between a polyhydroxy compound and a polybasic acid, polyether polyols (e.g., poly(oxypropylene ether)polyol and poly (oxyethylene-propylene ether)polyol), polycarbonate type polyols and polyethylene terephthalate polyol, and polyisocyanate. In the case of the above-described polyurethane resin, for example, an unreacted hydroxyl group after the reaction of a polyol with a polyisocyanate may be utilized as a functional group capable of crosslinking with a melamine compound.

Polymers obtained by reacting a polyhydroxy compound (e.g., ethylene glycol, propylene glycol, glycerol and trimethylolpropane) with a polybasic acid are usually used as the aforementioned polyester resin. In the case of the above-described polyester resin, for example, an unreacted hydroxyl group and carboxyl group after the reaction of a polyol with a polybasic acid may be utilized as a functional group capable of crosslinking with a melamine compound of course, a third component having a functional group such as a hydroxyl group may be added.

Among the above-described polymers, acrylic resins and polyurethane resins are preferable and acrylic resins are particularly preferable.

In the invention, a matting agent, a surfactant, a lubricant and the like may be used together in the antistatic layer and the surface layer explained later if necessary. Examples of the matting agent include oxides, such as silicon oxide, aluminum oxide and magnesium oxide and polymers and copolymers, such as polymethyl methacrylate and polystyrene, which have a particle diameter of 0.01 μm to 10 μm. Examples of the surfactant include known anionic surfactants, cationic surfactants, amphoteric surfactants and nonionic surfactants. Examples of the lubricant include phosphates of higher alcohols having 8 to 22 carbon atoms and amino salts thereof; palmitic acid, stearic acid, behenic acid and their esters; and silicone compounds.

The conductive metal oxide particles as they are or a dispersion in which these metal oxide particles are dispersed in a solvent such as water (containing a dispersant and a binder as required) is added to and mixed with (or dispersed in as required) a water dispersion or aqueous solution containing the aforementioned polymer and melamine compound and appropriate additives to prepare a coating solution for forming the antistatic layer. The coating solution for forming the antistatic layer may be applied to the surface (on the side on which the photosensitive layer is not formed) of a plastic film such as a polyester by using well-known application method such as a dip coating method, air knife coating method, curtain coating method, wire bar coating method, gravure coating method and extrusion coating method. The plastic film, such as a polyester, to be coated may be any of those which have not been subjected to sequential biaxial orientation or simultaneous biaxial orientation or those which have been subjected to uniaxial orientation and have not been subjected to reorientation or those which have been subjected to biaxial orientation. The surface of the plastic support to be coated with the coating solution for forming the antistatic layer is preferably processed in advance by surface treatment such as ultraviolet ray treatment, corona treatment and glow discharge treatment.

The thickness of the antistatic layer in the invention is preferably in a range from 0.01 to 1 μm and more preferably in a range from 0.01 to 0.2 μm. When the thickness is in a range from 0.01 to 1 μm, the coating solution can be applied evenly and therefore coating unevenness of products is not caused and antistatic ability and scratch resistance are not deteriorated.

In the invention, the surface layer is disposed on the antistatic layer. The surface layer is disposed primarily to improve lubricity and scratch resistance and to aid the ability to prevent the conductive metal oxide particles from desorbing from the antistatic layer.

<Alkali-soluble Thermoplastic Resin Layer>

It is necessary that the alkali-soluble thermoplastic resin layer has cushioning ability so as to absorb the irregularities (namely, irregularities of pixels which have been already formed) of the base and is alkali-soluble so that it can be removed by an alkali developing solution. The resin contained in the alkali-soluble thermoplastic resin layer is preferably at least one type selected from saponified products of ethylene and an acrylate, saponified products of styrene and a (meth)acrylate copolymer, saponified products of vinyltoluene and a (meth)acrylate copolymer and saponified products of a poly(meth)acrylate and saponified products of (meth)acrylate copolymers such asbutyl(meth)acrylate/vinyl acetate copolymers. Further, it is possible to use polymers soluble in an aqueous alkali solution among organic polymers described in "Plastic Performance Handbook" (edited by Japan Plastic Industrial Association and All Japan Plastic Molding Industrial Association, issued by Industrial Investigating Association on Oct. 25, 1968). Also, among these thermoplastic resins, those having a softening point of 80° C. or less are preferable.

Also, a plasticizer, a polymer, a supercooling material, an adhesion improving agent, a surfactant, a releasing agent and the like may be compounded in these high molecular organic substances to control bonding strength to the (temporary) support. This makes it possible to control Tg. Preferable examples of the plasticizer include polypropylene glycol, polyethylene glycol, dioctyl phthalate, diheptyl phthalate, dibutyl phthalate, tricresyl phosphate, cresyl diphenyl phosphate, biphenyl diphenyl phosphate, polyethylene glycol mono(meth)acrylate, polyethylene glycol di(meth)acrylate, polypropylene glycol mono(meth)acrylate, polypropylene glycol di(meth)acrylate, addition reaction products of an epoxy resin and polyethylene glycol mono(meth)acrylate, addition reaction products of an organic diisocyanate and polyethylene glycol mono(meth)acrylate, addition reaction products of an organic diisocyanate and polypropylene glycol mono(meth)acrylate and condensation reaction products of bisphenol A and polyethylene glycol mono(meth)acrylate. The amount of the plasticizer in the alkali-soluble thermoplastic resin layer is generally 200% by weight or less and preferably in a range from 20 to 100% by weight based on the thermoplastic resin. The thickness of the alkali-soluble thermoplastic resin layer is preferably 6 μm or more. When the thickness of the thermoplastic resin layer is less than 6 μm, it is difficult to absorb the irregularities (a roughness of 1 μm or more) of the base completely. The upper limit of the thickness is generally about 100 μm or less and preferably 50 μm or less in view of developing ability and production aptitude.

Not only the hydrophobic support but also the alkali-soluble thermoplastic resin layer may be processed by surface treatment such as corona discharge treatment though this is not always necessary in the invention. In this case, the bonding strength force between layers after treatment is increased.

<Intermediate Layer>

The intermediate layer is formed so as to prevent oxygen from inhibiting polymerization in the photosensitive resin layer by exposure even when the polymerization is carried out in air. A known material may be used as the material for the intermediate layer as far as it is dispersed or dissolved in water or an aqueous alkali solution and has low oxygen permeability. Examples of the material for the intermediate layer include polyvinyl ether/maleic acid anhydride polymers, water-soluble salts of carboxyalkyl celluloses, water-soluble cellulose ethers, water-soluble salts of carboxyalkyl starch, polyvinyl alcohol, polyvinyl pyrrolidone, polyacrylamides, water-soluble polyamides, water-soluble salts of polyacrylic acid, gelatin, ethylene oxide polymers, water-soluble salts of starches and their analogues, styrene/maleic acid copolymers, maleate resin as described in JP-A No. 46-2121 and JP-B No. 56-40824 and combinations of these compounds. In particular, a combination of polyvinyl alcohol and polyvinyl pyrrolidone is preferable. The polyvinyl alcohol preferably has a saponification ratio of 80% or more. The content of the polyvinyl pyrrolidone is generally 1 to 75% by weight, preferably 1 to 60% by weight and particularly preferably 10 to 50% by weight of the solid of the intermediate layer. When the content is less than 1% by weight, only insufficient bonding strength to the photosensitive resin layer is obtained whereas when the content exceeds 75% by weight, the ability to shut out oxygen is deteriorated. The thickness of the intermediate layer is as very thin as 0.1 to 5 μm and is particularly preferably 0.5 to 2 μm. When the thickness is in a range from 0.1 to 5 μm, oxygen permeability is not too high and too much time is not taken for developing or for removing the intermediate layer.

<Photosensitive Color Resin Layer>

The photosensitive color resin layer is a layer formed of a photosensitive resin composition made of an alkali-soluble binder, an ethylenic unsaturated double bond-containing monomer which can be addition-polymerized by irradiation with light, a photopolymerization initiator and a colorant.

Examples of the alkali-soluble binder include polymers having a carboxylic acid group at the side chain, for example, methacrylic acid copolymers, acrylic acid copolymers, itaconic acid copolymers, crotonic acid copolymers, maleic acid copolymers and partially esterified maleic acid copolymers as described in JP-A No. 59-44615, JP-B Nos. 54-34327, 58-12577, 54-25957, JP-A Nos. 59-53836 and 59-71048. Also, cellulose derivatives having a carboxylic acid group at the side chain may be exemplified. Besides the above compounds, those obtained by adding a cyclic acid anhydride to a polymer having a hydroxyl group are preferably used. Particularly, copolymers of benzyl(meth)acrylate and a (meth)acrylic acid and copolymers of benzyl(meth)acrylate, a (meth)acrylic acid and other monomer as described in U.S. Pat. No. 4,139,391 may be exemplified.

As the alkali-soluble binder polymer, those having an acid value ranging from 30 to 400 mg KOH/g and a weight average molecular weight ranging from 1,000 to 300,000 are used. Moreover, an alkali-insoluble polymer may be added to the photosensitive color resin layer to the extent that developing characteristics and the like are not adversely affected, to improve various abilities, for example, the strength of the cured film. Examples of such polymers include alcohol-soluble nylon and epoxy resins. The content of the binder based on the total solid of the photosensitive resin composition is 10 to 95% by weight and preferably 20 to 90% by weight. In the content ranging from 10 to 95% by weight, the adhesion of the photosensitive color resin layer is not too high and the layer to be formed is not deteriorated in strength and photosensitivity.

<Photopolymerization Initiator>

Examples of the aforementioned photopolymerization initiator include vicinal polyketaldonyl compounds as described in U.S. Pat. No. 2,367,660, acyloin ether compounds as described in U.S. Pat. No. 2,448,828, aromatic acyloin compounds substituted with an α-hydrocarbon as described in U.S. Pat. No. 2,722,512, polynucleic quinone compounds as described in U.S. Pat. Nos. 3,046,127 and 2,951,758, combinations of triarylimidazole dimers and p-aminoketones as described in U.S. Pat. No. 3,549,367, benzothiazole compounds and trihalomethyl-s-triazine compounds as described in JP-B No. 51-48516, trihalomethyl-s-triazine compounds as described in U.S. Pat. No. 4,239,850 and trihalomethyloxadiazole compounds as described in U.S. Pat. No. 4,212,976. Particularly, trihalomethyl-s-triazine, trihalomethyloxadiazole and triarylimidazole dimers are preferable. In the photosensitive resin composition, the content of the photopolymerization initiator based on the total solid is generally 0.5 to 20% by weight and preferably 1 to 15% by weight. When the content is in a range from 0.5 to 20% by weight, photosensitivity and the strength of an image are not low and the effect of improving the performance is found.

Examples of the ethylenic unsaturated double bond-containing monomer which can be addition-polymerized by irradiation with light include compounds having at least one addition-polymerizable ethylenic unsaturated group in the molecule and a boiling point of 100° C. or more under normal pressure. Specific examples of these compounds include monofunctional acrylates and monofunctional methacrylates such as polyethylene glycol mono(meth)acrylate, polypropylene glycol mono(meth)acrylate and phenoxyethyl(meth)acrylate; and polyfunctional acrylates and polyfunctional methacrylates such as polyethylene glycol di(meth)acrylate, polypropylene glycol di(meth)acrylate, trimethylolethane triacrylate, trimethylolpropane triacrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth) acrylate, trimethylolpropane tri (acryloyloxypropyl) ether, tri(acryloyloxyethyl) isocyanurate, tri(acryloyloxyethyl)cyanurate, glycerol tri (meth)acrylate; and (meth)acrylates obtained by adding ethylene oxide or propylene oxide to polyfunctional alcohols such as trimethylolpropane and glycerol, followed by (meth) acrylating.

Further, specific examples include polyfunctional acrylates and methacrylates such as urethaneacrylates as described in JP-B Nos. 48-41708, 50-6034 and JP-A No. 51-37193; polyester acrylates as described in JP-A No. 48-64183, JP-B Nos. 49-43191 and 52-30490; and epoxy-acrylates which are reaction products of epoxy resins and (meth)acrylic acids. Among these compounds, trimethylol-propane tri(meth)acrylate, pentaerythritol tetra(meth) acrylate, dipentaerythritol hexa(meth)acrylate and dipentaerythritol penta(meth)acrylate are preferable. The monomers which have an ethylenic unsaturated double bond and are addition-polymerized by irradiation with light may be used alone or in combination. The content of these monomers based on the total solid of the light-shielding and photosensitive resin composition is generally 5 to 50% by weight and preferably 10 to 40% by weight. When the content of these monomers is in a range from 5 to 50% by weight, photosensitivity and the strength of an image are not deteriorated and the adhesion of the photosensitive layer does not become excessive.

<Colorants>

Known red, green, blue, yellow, violet, magenta, cyan and black pigments and dyes may be used as the above-mentioned colorant. Preferable examples of the colorant include Victoria Pure Blue BO (C.I. 42595), Auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR(C.I. Pigment Yellow 83), Permanent Carmine FBB (C.I. Pigment Red 146), Hosterberm Red ESB (C.I. Pigment Violet 19), Permanent Ruby FBH (C.I. Pigment Red 11), Faster Pink B Supra (C.I. Pigment Red 81), Monastral Fast Blue (C.I. Pigment Blue 15), Monolite Fast Black B (C.I. Pigment Black 1) and Carbon Black.

Further, examples of a pigment particularly preferable for the formation of a color filter include C.I. Pigment Red 97, C.I. Pigment Red 122, C.I. Pigment Red 149, C.I. Pigment Red 168, C.I. Pigment Red 177, C.I. Pigment Red 180, C.I. Pigment 192, C.I. Pigment Red 215, C.I. Pigment Green 7, C.I. Pigment Green 36, C.I. Pigment Blue 15:1, C.I. Pigment Blue 15:4, C.I. Pigment 15:6, C.I. Pigment Blue 22, C.I. Pigment Blue 60, C.I. Pigment Blue 64, C.I. Pigment Yellow 139, C.I. Pigment Yellow 83 and C.I. Pigment Violet 23. The aforementioned pigments and dyes have an average particle diameter of generally 5 μm or less and preferably 1 μm or less. When a color filter is produced, those having an average particle diameter of 0.5 μm or less are preferably used.

<Others>

The photosensitive resin composition used in the invention preferably contains a thermal polymerization preventive agent besides the above components. Examples of the thermal polymerization preventive agent include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole and phenothiazine.

If necessary, a known additive such as a plasticizer, a surfactant and a solvent may be added to the composition used in the invention. The thickness of the photosensitive color resin layer formed of the photosensitive resin composition is preferably in a range from 0.5 to 10 μm and particularly preferably in a range from 1 to 5 μm.

<Formation of the Photosensitive Transfer Material>

The photosensitive resin composition used in the invention may be obtained, for example, by dispersing a mixture of the colorant and the binder and then by mixing the resulting mixture with other materials.

The photosensitive transfer material of the invention may be obtained, for example, by applying the coating solution for the formation of the alkali-soluble thermoplastic resin layer to a support, drying the coating layer to form the alkali-soluble thermoplastic resin layer, applying the coating solution for the formation of the intermediate layer which coating solution does not solve the alkali-soluble thermoplastic resin layer to the alkali-soluble thermoplastic resin layer, drying the coating layer and then applying the coating solution for the formation of the photosensitive color resin layer which coating solution does not solve the intermediate layer to the intermediate layer, drying the coating layer to form the photosensitive color resin layer. Alternatively, the photosensitive transfer material may be made by forming the photosensitive color resin layer on a cover sheet explained later and by applying the resulting sheet to a sheet prepared by forming the alkali-soluble thermoplastic resin layer and the intermediate layer on the support in the same manner as above. Also, the photosensitive transfer material may be made by forming the alkali-soluble thermoplastic resin layer on the support and by applying to the above alkali-soluble thermoplastic resin layer a sheet prepared by forming the photosensitive color resin layer and the intermediate layer on the cover sheet.

The photosensitive color resin layer used in the invention may be formed by applying the coating solution of the photosensitive resin composition (by dissolving the composition in an organic solvent in usual) to the intermediate layer (or the cover sheet) by using a known method. For example, photosensitive color resin layer may be formed by applying the coating solution of the composition with a coater such as a spinner, whirler, roller coater, curtain coater, knife coater, wire bar coater and extruder, followed by drying. Examples of the solvent to be used for the formation of the coating solution for the photosensitive resin composition include methyl ethyl ketone, propylene glycol monomethyl ether, propylene glycol monomethyl ether acetate, cyclohexanone, cyclohexanol, ethyl lactate, methyl lactate and caprolactam.

It is preferable to dispose a thin cover sheet on the above photosensitive color resin layer to protect the photosensitive color resin layer from being contaminated and damaged during storage. Although the cover sheet may be formed of the same type as or similar material to that of the (temporary) support, it is necessary for the material to be easily separable from the photosensitive color resin layer. Preferable examples of the cover sheet include silicone paper, a polyolefin sheet and a polytetrafluoroethylene sheet. The thickness of the cover sheet is generally 5 to 100 $\mu$m and preferably 10 to 30 $\mu$m.

There is a problem that when the (temporary) support is peeled off after the photosensitive color resin layer of the photosensitive transfer material is bonded to a permanent support such as glass, the charged support (film) occasionally gives unpleasant electrical shock to a human body or dusts adhere to the charged substrate. Therefore, it is preferable to form a conductive layer on the support or to carry out treatment for imparting conductivity to the support itself. Also, when the conductive layer is disposed on the opposite side of the support (on the side on which the photosensitive color resin layer is not formed), it is preferable to form a hydrophobic polymer layer to improve scratch resistance.

<Production of Multicolor Image Sheet>

A multicolor image sheet such as a color filter is produced using the above photosensitive transfer material, for example, in the following manner. As to the formation of each of the aforementioned red, green and blue pixels, for example, red pixels are formed by preparing a photosensitive transfer material (transfer sheet) having a photosensitive red resin layer and transferring the photosensitive red resin layer to the surface of a substrate, followed by exposing imagewise and developing. The green and blue pixels are formed in the same manner. Alternatively, the photosensitive resin layer may be formed not by using a transfer sheet but by applying and drying a photosensitive resin coating solution for forming pixels. When three types of pixel, namely red, green and blue pixels are arranged, any type of arrangement, for example, a mosaic type, triangle type and four-pixel arrangement type may be adopted.

A photosensitive black resin layer is transferred to the upper surface of pixels and space between the pixels by using a photosensitive transfer material having the photosensitive black resin layer, followed by exposing from the backside (the side with no pixels) and developing, to form a black matrix in the space between each pixel. The image sheet is heated to thereby cure the uncured portions (the same operation is carried out for each pixel).

The above photosensitive transfer material is usually applied to the surface of the substrate in the following manner. Specifically, after the cover sheet on the photosensitive color resin layer of the photosensitive transfer material is removed, the photosensitive transfer material is overlapped on the surface of the substrate and then bonded to the surface of the substrate under pressure and heating. For the lamination, a known laminator such as a laminator, vacuum laminator and an auto-cut laminator which can more improve productivity may be used. Thereafter, the (temporary) support is peeled off, then the photosensitive color resin layer is exposed to light through a predetermined mask, the alkali-soluble thermoplastic resin and the intermediate layer and then the unexposed regions are removed (development). A light source used for the above-described exposure is properly selected according to the photosensitivity of the photosensitive color resin layer. For example, a known light source such as an extra-high pressure mercury lamp, xenon lamp, carbon arc lamp and an argon laser may be used. As described in JP-A No. 6-59119, for example, an optical filter having a transmittance of 2% or less for light having a wavelength of 400 nm or more may be used together.

An aqueous dilute solution of an alkaline material is used as a developing solution of the above-described photosensitive color resin layer. Further, a solution obtained by adding a small amount of an organic solvent miscible with water to the above dilute solution may be used. Preferable examples of the alkaline material include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal methasilicates (e.g., sodium methasilicate and potassiummethasilicate), triethanolamine, diethanolamine, monoethanolamine, morpholine, tetraalkylammonium hydroxides (e.g., tetramethylammonium hydroxide) and trisodium phosphate. The concentration of the alkaline material is 0.01% by weight to 30% by weight and the pH of the developing solution is preferably 8 to 14.

Preferable examples of the organic solvent miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetamide, hexamethylphosphoramide, ethyl lactate, methyl lactate, $\epsilon$-caprolactam and N-methylpyrrolidone. The concentration of the organic solvent miscible with water is generally 0.1 to 30% by weight.

The developing solution may be used in the form of a bath solution or a spray solution. For the removal of the uncured portions of the photosensitive color resin layer, a method in which the uncured portions are rubbed by a rotating brush in the developing solution or by a wet sponge or a method utilizing spraying pressure when the developing solution is sprayed may be used appropriately. The temperature of the developing solution is preferably in a range from room temperature to 40° C. in usual. A washing step may be added after developing treatment. Also, the alkali-soluble thermoplastic resin layer, the intermediate layer and the photosensitive color resin layer may be developed at a time. However, in order to decrease developing unevenness and the deterioration of layers caused by the developing solution during developing, it is preferable to develop the photosensitive color resin layer after dissolving and removing the alkali-soluble thermoplastic resin layer and the intermediate layer. When developing the photosensitive color resin layer afterwards, such a developing solution as not to deteriorate the photosensitive color resin layer is preferably used to remove the alkali-soluble thermoplastic resin layer and the intermediate layer. This method may be practiced by selecting a developing solution in consideration of a difference in dissolution rate between the alkali-soluble thermoplastic resin layer/the intermediate layer and the photosensitive color resin layer or by properly combining developing conditions such as solution temperature, spraying pressure and rubbing pressure. This method makes it possible to restrain the occurrence of developing unevenness.

After the developing step, heat treatment is carried out. Specifically, a support provided with the color resin layer cured by exposure (hereinafter referred to as a photo-cured layer) is heated in an electric furnace or dryer or heated by irradiating the photo-cured layer with an infrared lamp. As to the heating temperature and time, the photo-cured layer is preferably heated at a temperature ranging from about 120° C. to about 250° C. for about 10 to 300 minutes in usual to acquire sufficient solvent resistance and alkali resistance though the heating temperature and time are dependent on the polymerizable composition to be used and on the thickness of the layer.

The photosensitive transfer material of the invention may be used advantageously for, besides the formation of a color filter, the formation of print wiring boards and multicolor images. In the formation of print wiring boards, a known copper-applied laminate plate is usually used as the substrate.

The invention will be explained in detail by way of examples. However, the invention is not limited to the examples.

EXAMPLES

Example 1

The following peelable layer coating solution H1 was applied to one surface of a polyethylene terephthalate film which had a thickness of 75 μm and both surfaces of which film were subjected to corona discharge treatment after it was biaxially oriented and fixed at 240° C. for 10 minutes. The coating layer was dried at 170° C. for 30 seconds to form a peelable layer having a thickness of 0.03 μm.

Peelable Layer Coating Solution H1

| | |
|---|---|
| Polyolefin (Chemipearl S-120; 27% by weight, methacrylic acid modified ratio: 5 to 20%, manufactured by Mitsui Chemicals, Inc.) | 3.0 parts by mass |
| Colloidal silica (Snowtex C, manufactured by Nissan Chemicals Co., Ltd.) | 2.0 parts by mass |
| Epoxy compound (Denacol EX-614B; Nagase Kasei K.K.) | 0.3 parts by mass |
| Polyethylene sulfonate (molecular weight: 1000 to 5000) | 0.1 parts by mass |
| Surfactant: sodium p-dodecylbenzenesulfonate | 0.1 parts by mass |
| Distilled water | 94.5 parts by mass |

Next, the following antistatic layer coating solution was applied to the side opposite to the surface of the polyethylene terephthalate film on which surface the peelable layer had been formed and the coating layer was dried at 180° C. for 30 minutes to form an antistatic layer having a thickness of 0.08 μm.

Antistatic Layer Coating Solution

| | |
|---|---|
| Water dispersion of an acrylic resin (copolymer of a (meth)acrylate; Jurimer SEK 401, solid content: 40% by weight, manufactured by Nihon Junyaku Co., Ltd.) | 4.1 parts by mass |
| Tin oxide-antimony oxide dispersion (average particle diameter: 0.1 μm; 30% by weight) | 16.5 parts by mass |
| Polyoxyethylene phenyl ether | 0.1 parts by mass |
| Melamine compound (Sumitex Resin M-3, effective component: 80% by weight, manufactured by Nagase Chemicals Ltd.) | 1.0 parts by mass |
| Surfactant: sodium p-dodecylbenzenesulfonate | 0.1 parts by mass |

Distilled water was added so that a total of the solution became 100 parts by mass.

The above-described peelable layer coating solution H1 was applied to the antistatic layer and the coating layer was dried at 170° C. for 30 minutes to form a protective layer having a thickness of 0.03 μm, thereby forming a temporary support S1.

A coating solution made of a thermoplastic resin layer formulation Cu1 shown below was applied to the temporary support S1 and the coating layer was dried to form a thermoplastic resin layer with a dry film thickness of 20 μm.

Thermoplastic Resin Layer Formulation Cu1:

Thermoplastic resin (A)
methyl methacrylate/2-ethylhexyl acrylate/benzyl methacrylate/methacrylic acid copolymer (copolymerization composition ratio (mol ratio)=55/30/10/5, weight average molecular weight=100,000, Tg≈70° C.) 7 parts by mass Thermoplastic Resin (B)
styrene/acrylic acid copolymer (copolymerization composition ratio (mol ratio)=65/35, weight average molecular weight=10,000, Tg≈100° C.) 13 parts by mass

| | |
|---|---|
| Plasticizer Polypropylene glycol triol type, average molecular weight: 1,000 (Sunnix GP 1000, manufactured by Sanyo Chemical Industries) | 9 parts by mass |
| Methyl ethyl ketone | 63 parts by mass |
| Methanol | 15 parts by mass |
| Fluorine-containing polymer (20% by weight methyl isobutyl ketone solution) | 0.15 parts by mass |

The content of polypropylene glycol was 31%.

Next, a coating solution of the following formulation P1 was applied to the thermoplastic resin layer and the coating layer was dried to form an intermediate layer with a dry film thickness of 1.6 μm.

Intermediate Layer Formulation P1:

| | |
|---|---|
| PVA205 (polyvinyl alcohol manufactured by Kuraray Co., Ltd., degree of saponification = 88%, degree of polymerization = 550) | 100 parts by mass |
| Polyvinyl pyrrolidone (PVP, K-30, manufactured by GAF Corporation) | 50 parts by mass |

-continued

| | |
|---|---|
| Distilled water | 1850 parts by mass |
| Methanol | 1000 parts by mass |

Photosensitive solutions each having formulation shown in Table 1 for four color layers, namely, a black layer (K layer), red layer (R layer), green layer (G layer) and blue layer (B layer) were applied to four temporary supports S1 provided with the aforementioned thermoplastic resin layer and intermediate layer, respectively. The coating layers were dried to form a color photosensitive resin layer with a dry film thickness of 2 µm.

TABLE 1

| | Red (g) | Green (g) | Blue (g) | Black (g) |
|---|---|---|---|---|
| Benzyl methacrylate/methacrylic acid copolymer (mol ratio = 72/28, molecular weight: 30,000) | 30.0 | 33.5 | 34.1 | 40.6 |
| Dipentaerythritol hexaacrylate | 28.4 | 25.2 | 32.3 | 30.5 |
| F177P (fluorine-containing surfactant, manufactured by Dainippon Ink and Chemicals, Inc.) | 0.37 | 0.19 | 0.19 | 0.30 |
| 2,4-bis(trichloromethyl)-6-[4-(N,N-diethoxycarbonylmethyl)-3-bromophenyl]-S-triazine | 1.31 | 0 | 1.52 | 1.47 |
| 2-Trichloromethyl-5-(p-styrylstyryl)-1,3,4-oxadiazole | 0 | 1.2 | 0 | 0 |
| Phenothiazine | 0.022 | 0.020 | 0.026 | 0.015 |
| Chromophthal Red A2B | 27 | 0 | 0 | 0 |
| Quinophthalone dye (yellow) | 10.3 | 23.0 | 0 | 0 |
| Monastral Green 6Y | 0 | 23.0 | 0 | 0 |
| Heliogen Blue L6700F | 0 | 0 | 25.6 | 0 |
| Lyonogen Violet RL | 0 | 0 | 0.8 | 0 |
| Carbon black (black color) | — | — | — | 27.1 |
| Methoxypropylene glycol acetate | 310 | 310 | 310 | 310 |
| Methyl ethyl ketone | 460 | 460 | 460 | 460 |

Using the photosensitive transfer material, a color filter was produced in the following method. The cover sheet of the red photosensitive transfer material was peeled off and then the photosensitive resin layer of the photosensitive transfer material was laminated on a transparent glass substrate (thickness: 1.1 mm) by using a laminator (VP-11, manufactured by Taisei Laminator K.K.) underpressure (10 kg/cm) and heating (130° C.) at a lamination rate of 0.7 m/min.

Peelablility of the laminated photosensitive transfer material was evaluated as described later.

Next, the photosensitive transfer material was exposed to light through a predetermined photomask and the thermoplastic resin layer and the intermediate layer was removed by dissolving them with an aqueous 1% triethanolamine solution. The shortest time required for completely removing these layers was 30 seconds. Next, the photosensitive resin layer was developed with an aqueous 1% sodium carbonate solution to remove unnecessary portions and then a red pixel pattern was formed on the glass substrate. Next, the green photosensitive transfer material was laminated on the glass substrate on which the red pixel pattern had been formed in the same manner as above and peeling, exposure and developing processes were carried out to form a green pixel pattern. The same process was repeated using the blue and black photosensitive transfer materials respectively to form a color filter on the transparent substrate.

Examples 2 to 4

Photosensitive transfer materials were produced in the same manner as in Example 1 except that Chemipearl S110 (methacrylic acid modified ratio: 5 to 20%), Chemipearl S111 (methacrylic acid modified ratio: 5 to 20%) and Chemipearl S650 (methacrylic acid modified ratio: 20%) were respectively used instead of Chemipearl S120 such that the amount of solid components to be applied was the same as that of Example 1.

Example 5

A photosensitive transfer material was produced in the same manner as in Example 1 except that Teflon latex (Daifree ME313, manufactured by Daikin Industries, Ltd.) was used instead of the polyolefin such that the amount of solid components to be applied was the same as that of Example 1.

Example 6

A photosensitive transfer material was produced in the same manner as in Example 1 except that the half of the polyolefin was replaced by Teflon latex used in Example 5 (Daifree ME313, manufactured by Daikin Industries, Ltd.)

Example 7

The following undercoat layer coating solution was applied to one surface of a polyethylene terephthalate film as an undercoat for a peelable layer and the coating layer was dried at 180° C. for 30 minutes to form an undercoat layer having a thickness of 0.3 µm and then the same procedures as those in Example 1 were conducted to produce a photosensitive transfer material.

| | |
|---|---|
| Formulation of the undercoat layer coating solution Styrene/butadiene copolymer latex (styrene:butadiene = 67:33, solid content: 40% by weight) | 6.3 parts by mass |
| Sodium 2,4-dichloro-6-hydroxy-s-triazide | 0.2 parts by mass |
| Surfactant: sodium p-dodecylbenzenesulfonate | 0.1 parts by mass |
| Distilled water | 73.5 parts by mass |

Examples 8 to 9

Photosensitive transfer materials were produced in the same manner as in Example 1 except that Denacol EX-810 and Denacol EX-811 were respectively used as the crosslinking agent instead of Denacol EX-614B such that the effective component was fixed.

Examples 10 to 12

Photosensitive transfer materials were produced in the same manner as in Example 1 except that hexamethoxymelamine, Sumitex Resin M-3 (water-soluble melamine, effective component: 80%, manufactured by Sumitomo Chemical Co., Ltd.) and Sumireds Resin 613 (water-soluble melamine, effective component: 80%, manufactured by Sumitomo Chemical Co., Ltd.) were respectively used as the crosslinking agent instead of Denacol EX-614B such that the effective component was fixed.

Example 13

A photosensitive transfer material was produced in the same manner as in Example 1 except that a blocked isocyanate compound (trifunctional) having a carbamoyl sulfonate group was used as the crosslinking agent such that the effective component was fixed.

Comparative Example 1

A photosensitive transfer material was produced in the same manner as in Example 1 except that the peelable layer was not formed.

Comparative Example 2

A photosensitive transfer material was produced in the same manner as in Example 1 except that a gelatin was added in place of the polyolefin such that the amount of a solid content to be applied was the same as that of Example 1.

Comparative Example 3

A photosensitive transfer material was produced in the same manner as in Example 1 except that a styrene/butadiene copolymer latex (styrene:butadiene=67:33, solid content: 40% by weight) was added in place of the polyolefin such that the amount of a solid content to be applied was the same as that of Example 1.

[Evaluation of the Peelability of the Temporary Support]

In the photosensitive transfer materials obtained in Examples 1 to 13 and Comparative Examples 1 to 3; the temporary support S1 was peeled from the photosensitive transfer material. The temporary support and the surface of the transferred outermost layer were allowed to reflect tungsten lamp light which was irradiated at an incident angle of 30 to 60 degrees to observe them visually and by using a microscope, thereby making evaluation as follows. The results are shown in Table 2.

A: The peeled surface was even and no peeling trace was seen at all, showing excellently good peelability.

B: Although dot-like pieces of the thermoplastic resin layer were seen slightly at the edge portion of the temporary support, the thermoplastic resin layer did not adhere to the temporary support in other portions, showing good peelability.

C: Although linear pieces of the thermoplastic resin layer were seen a little at the edge portion of the temporary support, the thermoplastic resin layer did not adhere to the temporary support, showing normal peeling.

D: The thermoplastic resin layer adhered to the temporary support not only at the edge portion but also in other portions slightly, showing inferior peelability.

E: The thermoplastic resin layer adhered to the whole surface of the temporary support, showing remarkably inferior peelability.

The A to C levels are practical levels.

[Evaluation of Unevenness of a Color Filter]

The cover sheet of the red photosensitive transfer materials obtained in the aforementioned Examples 1 to 13 and Comparative Examples 1 to 3 were peeled off. The photosensitive resin layer of the photosensitive transfer material was laminated on a transparent glass substrate (thickness: 1.1 mm) by using a laminator (VP-11, manufactured by Taisei Laminator K.K.) under pressure (10 kg/cm) and heating (130° C.) at a lamination rate of 0.7 m/min. and the temporary support was removed. Next, the photosensitive red resin layer was exposed to light through a photomask (negative type photomask with square pixels having a side length of 20 to 60 $\mu$m) by using an extra-high mercury lamp. The amount of the exposure was 20 mJ/cm$^2$. Thereafter, the alkali-soluble thermoplastic resin layer was removed by dissolving it with an aqueous 1% triethanolamine solution for 30 seconds. Then, the photosensitive red resin layer was developed with an aqueous 1% sodium carbonate solution to remove the unexposed portions, thereby forming a red pixel (R) pattern. A glass substrate having red pixels was heated at 220° C. for 130 minutes to cure the pixel portions sufficiently to make a color filter provided with only red pixels. The color filter was observed visually and by using a microscope to make evaluation according to the following five ratings. The results are shown in Table 2.

A: No mottle was observed at all.
B: Mottles were slightly observed.
C: Mottles were observed a little.
D: Many mottles were observed.
E: Mottles were observed on the entire surface.

The A to C levels are practical levels.

TABLE 2

|  | Peelability | Mottles of a color filter |
|---|---|---|
| Example 1 | A to B | A to B |
| Example 2 | A to B | A to B |
| Example 3 | A to B | A to B |
| Example 4 | B | B |
| Example 5 | A | A |
| Example 6 | A | A |
| Example 7 | A to B | A to B |
| Example 8 | A to B | A to B |
| Example 9 | A to B | A to B |
| Example 10 | A to B | A to B |
| Example 11 | A to B | A to B |
| Example 12 | A to B | A to B |
| Example 13 | A to B | A to B |
| Comparative Example 1 | C to D | C to D |
| Comparative Example 2 | E | E |
| Comparative Example 3 | D to E | D to E |

All the examples using the peelable layer according to the present invention had good peelability, no unevenness was observed also in the color filter formed with the photosensitive transfer material of the invention and the color filter had high sensitivity and resolution. Examples 5 and 6 using a Teflon latex had particularly good peelability.

What is claimed is:

1. A photosensitive transfer material comprising a temporary support, a peelable layer, a alkali-soluble thermoplastic resin layer, an intermediate layer and a photosensitive resin layer that are disposed in this order, wherein the bonding strength between the peelable layer and the thermoplastic resin layer is the smallest of all the bonding strengths between neighboring layers.

2. The photosensitive transfer material of claim 1, wherein the peelable layer contains at least one type selected from 1) a polyolefin having a carboxyl group and/or a carboxylate group, or 2) a polyolefin having a sulfonic acid group and/or a sulfonate group and 3) a fluorocarbon derivative.

3. The photosensitive transfer material of claim 2, wherein the peelable layer contains at least one type selected from an epoxy compound, a blocked isocyanate and a melamine compound.

4. The photosensitive transfer material of claim 2, wherein the peelable layer contains colloidal silica.

5. The photosensitive transfer material of claim 2, wherein the peelable layer contains a polyolefin having a methacrylic acid modified ratio of 5 to 20%.

6. The photosensitive transfer material of claim 5, wherein the peelable layer contains a polyethylene sulfonate.

7. The photosensitive transfer material of claim 5, wherein the peelable layer contains a fluorocarbon derivative.

8. The photosensitive transfer material of claim 2, wherein the peelable layer contains a polyethylene sulfonate.

9. The photosensitive transfer material of claim 2, wherein the peelable layer contains a fluorocarbon derivative.

10. The photosensitive transfer material of claim 2, further comprising an undercoat layer between the temporary support and the peelable layer.

11. The photosensitive transfer material of claim 2, further comprising an antistatic layer on the temporary support on the side opposite to the side on which the peelable layer is disposed.

12. A color filter formed using the photosensitive transfer material as claimed in claim 2.

13. The photosensitive transfer material of claim 1, wherein the peelable layer contains at least one type selected from an epoxy compound, a blocked isocyanate and a melamine compound.

14. The photosensitive transfer material of claim 13, wherein the peelable layer contains colloidal silica.

15. A color filter formed using the photosensitive transfer material as claimed in claim 13.

16. The photosensitive transfer material of claim 1, wherein the peelable layer contains colloidal silica.

17. A color filter formed using the photosensitive transfer material as claimed in claim 16.

18. The photosensitive transfer material of claim 1, further comprising an undercoat layer between the temporary support and the peelable layer.

19. The photosensitive transfer material of claim 1, further comprising an antistatic layer on the temporary support on the side opposite to the side on which the peelable layer is disposed.

20. A color filter formed using the photosensitive transfer material as claimed in claim 1.

* * * * *